United States Patent [19]
Crumly et al.

[11] Patent Number: 6,007,669
[45] Date of Patent: Dec. 28, 1999

[54] LAYER TO LAYER INTERCONNECT

[75] Inventors: William R. Crumly, Anaheim; Haim Feigenbaum; Eric Dean Jensen, both of Irvine; Pete Henry Hudson, Escondido, all of Calif.; John De Nuto, Warren, Ohio

[73] Assignee: Packard Hughes Interconnect Company, Irvine, Calif.

[21] Appl. No.: 09/003,651

[22] Filed: Jan. 7, 1998

[51] Int. Cl.$^6$ .................................................. H05K 3/36
[52] U.S. Cl. .......................... 156/303.1; 29/830; 29/837; 156/293; 156/295
[58] Field of Search ..................................... 156/150, 151, 156/293, 295, 303.1; 29/830, 837

[56] References Cited

U.S. PATENT DOCUMENTS

| | | | |
|---|---|---|---|
| 5,207,887 | 5/1993 | Crumly et al. | 205/78 |
| 5,306,546 | 4/1994 | Schreiber et al. | 428/257 |
| 5,412,539 | 5/1995 | Elwell et al. | 361/174 |

*Primary Examiner*—Francis J. Lorin
*Attorney, Agent, or Firm*—Patrick M. Griffin

[57] ABSTRACT

The present invention includes stack flexible circuit layers having raised features or bumps for Z-axis interconnection to another circuit layer or electrical component. An intermediate or adhesive layer separates each circuit layer. The multiple layers are stacked with the raised features from one layer aligning with pads of an overlying or underlying layer and are laminated so that the raised features pierce the intermediate or adhesive layer and make electrical contact with the corresponding pad of the adjacent circuit layer. The raised features may have a shape sufficient to penetrate the intermediate and/or the adhesive layer allowing blind vias to be made without pre-drilling the intermediate or adhesive layers. The intermediate layer of film can have a function other than or in addition to that of an adhesive. For example, in a connector application where the raised feature is used to make contact to corresponding pads, a film that has a low permeability to water could be placed between the raised features and corresponding pads on the next layer. The low water permeability film would act as a sealant to prevent environmental attack on the connection. The raised feature would penetrate the sealant to make electrical contact to a corresponding pad. This would allow the connector to be disassembled and reconnected.

13 Claims, 2 Drawing Sheets

LAYER TO LAYER INTERCONNECT

TECHNICAL FIELD

A multi-level electrical interconnection substrate module and method of making the same.

BACKGROUND OF THE INVENTION

A variety of multi-level electrical interconnection systems are known. Elwell et al U.S. Pat. No. 5,412,539 discloses a circuit having raised features, and a dielectric decal layer overlying the circuit. The decal layer has preformed holes extending therethrough and aligned with the raised features. A second circuit layer overlies the decal and includes contact pads overlying one of the preformed holes in the decal and the raised feature. Silver epoxy is used to make electrical connection between the raised feature on the first circuit layer and the contact pad on the second circuit layer.

Other similar systems are known. One such system includes a dielectric decal layer having preformed holes extending therethrough and an additional adhesive decal layer. The adhesive layer also has preformed holes to receive a raised feature of a first circuit layer. A second circuit layer overlies the adhesive decal and includes contact pads aligned with the raised features. The steps of forming holes in the dielectric and adhesive layers and aligning the holes with raised features all add cost to the overall system.

The present invention provides alternatives to and advantages over the prior art.

SUMMARY OF THE INVENTION

The present invention includes stack flexible circuit layers having raised features or bumps for Z-axis interconnection to another circuit layer or electrical component. An intermediate or adhesive layer separates each circuit layer. The multiple layers are stacked with the raised features from one layer aligning with pads of an overlying or underlying layer and are laminated so that the raised features pierce the intermediate or adhesive layer and makes electrical contact with the corresponding pad of the adjacent circuit layer or electrical component. The raised features may have a shape sufficient to penetrate the intermediate and/or the adhesive layer allowing blind vias to be made without pre-drilling the intermediate or adhesive layers. The intermediate layer may have a function other than or in addition to that of an adhesive. For example, in a connector application where the raised feature is used to make contact to corresponding pads, a layer that has a low permeability to water could be placed between the raised features and corresponding pads on the next layer. The low water permeability layer would act as a sealant to prevent environmental attack on the connection. The raised feature would penetrate the sealant to make electrical contact to a corresponding pad. This would allow the connector to be disassembled and reconnected.

These and other objects, features and advantages of the present invention will become apparent from the following brief description of the drawings, detailed description, and appended claims and drawings.

DESCRIPTION OF THE PREFERRED EMBODIMENT

Figure 1:
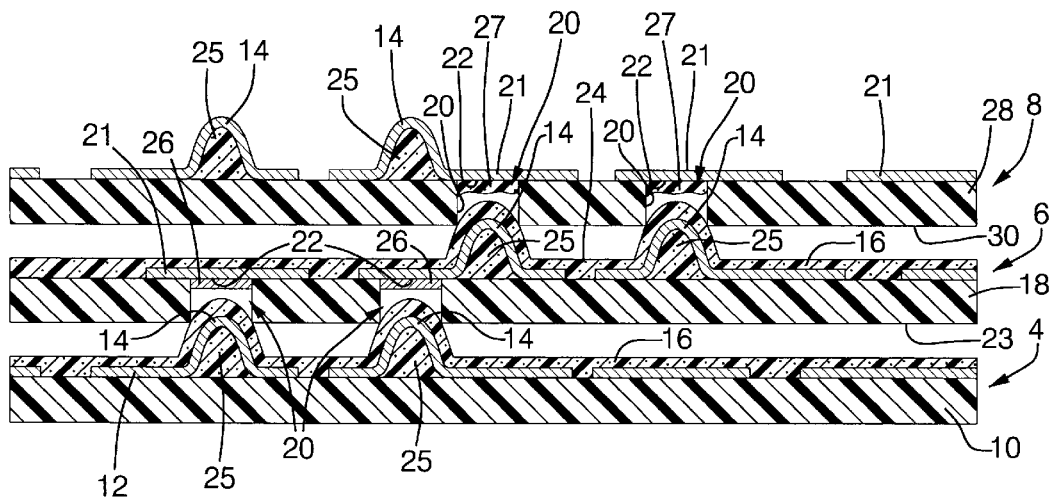
FIG. 1 is a sectional view of a multi-layer interconnection system according to the present invention before lamination or bonding.

Referring to FIG. 1, a first flexible circuit layer 4 is provided including a first dielectric layer 10 having copper traces 12 carried thereon. A suitable dielectric layer may include a flexible polyimide material such as Kapton® or similar material. The copper traces 12 have a raised feature or bump 14 extending above a planar surface of the first dielectric layer 10. An adhesive layer 16 is provided over the first circuit layer including the raised features 14. Preferably, the adhesive layer 16 is a solid sheet of material but may be a paste, gel liquid, semi-liquid or other coating.

A second flexible circuit layer 6 overlies the first circuit layer 14 and includes a second dielectric layer 18 which may have holes 20 formed therein and aligned to receive a portion of the raised feature 14 and adhesive layer 16. A second copper trace(s) 21 is provided on a top surface of the second dielectric layer 18 and includes a portion serving as a contact pad 22 overlying the associated holes 20 formed in the dielectric layer 18. The contact pad 22 also overlies an associated raised feature 14 on the first dielectric layer 10. Solder 26 may be plated or dipped on the pad 22 and/or the raised feature 14 so that the bump is soldered to the pad after lamination. If only one of the raised features 14 or pads 22 has solder on it, the other surface is made solderable by putting a gold layer on the other surface or other suitable method. Alternatively, the adhesive layer 16 may be applied to the bottom face 23 of the second dielectric layer 18.

Referring again to FIG. 1, an intermediate layer 24 having a function other than or in addition to adhesion may be provided over the second copper traces 21 of the second circuit layer 18. Alternatively, the intermediate layer 24 may be provided on a bottom face 30 of a third flexible circuit layer 8. For example, the intermediate layer 24 may have a low water permeability property. Like the adhesive layer 16, the intermediate layer 24 may be a solid sheet, paste, gel, liquid, semi-liquid or other coating. Optionally, additional materials 27 such as a silicone gel may be placed in the holes 20 formed in a third dielectric layer 28 or on the adhesive layer 16 before lamination of the layers. Multiple layers may be constructed in a similar fashion. Of course, the first, second and/or third dielectric layers 10, 18, 28 could be eliminated and only an adhesive layer utilized and still be within the scope of this invention.

Figure 2:
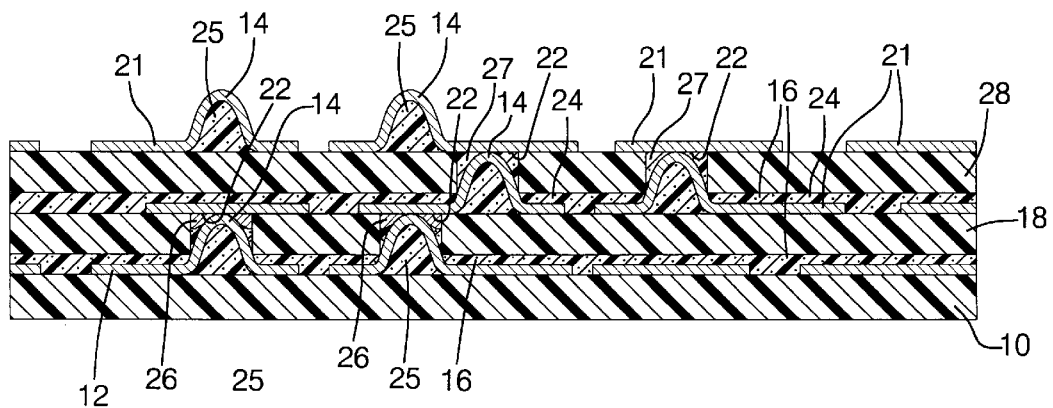
FIG. 2 is a sectional view of a multi-layer interconnection system according to the present invention after lamination or bonding.

As shown in FIG. 2, upon lamination of the multiple layers, the raised features 14 pierce through the adhesive 16 and/or intermediate layer 24 or additional materials 27 in the Z-axis direction to make electrical contact with the contact pad 22 or electrical trace 12, 21 of an adjacent electrical circuit. The shape of the raised feature 14 may vary such as semi-spherical or preferably cone-shaped. The cone-shaped raised features may be formed by a variety of methods. A flexible circuit may be provided with contact pads and the raised features formed by mechanically pressing a tool against the contact pad. Alternatively, the raised features may be provided by plating-up a metal or by depositing a bump as desired. Another method is a mandrel process illustrated in Crumly et al U.S. Pat. No. 5,207,887 issued May 4, 1993, the disclosure of which is hereby incorporated by reference. The raised feature 14 may vary in height but preferably is 4 mils high, a 1 mil radius at the tip and an 8 mil radius at the base of the cone. The underside of the raised feature 14 may be filled with a suitable material such as an epoxy 25 or adhesive. Of course, the raised feature 14 (preferably cone-shaped) does not have to be a metal material such as a copper trace, but could be an electrically conductive polymer such as silver-filled epoxy.

A suitable adhesive layer 24 useful in the present invention is of the type of modified epoxy, and is available from Courtoulds Company under the trade name Z-Flex. Preferably the adhesive layer has a thickness less than the height of the dot and preferably of about 1 mil to about 2 mils the height of the raised feature. Naturally, the adhesive layer may have any thickness suitable to be pierced by the raised features which may vary in size.

Preferably the multi-layer structure is laminated by heating the structure in a laminating press, at a temperature ranging from about 385° F. to about 400° F. and applying a pressure of about 300 psi to about 350 psi on the multi-layer system. The temperature should be sufficient to cause the adhesive to flow and the solder to reflow. A layer to layer interconnect could also be achieved without solder by precise selection of the bump geometry, adhesive type and lamination pressure.

Figure 3:
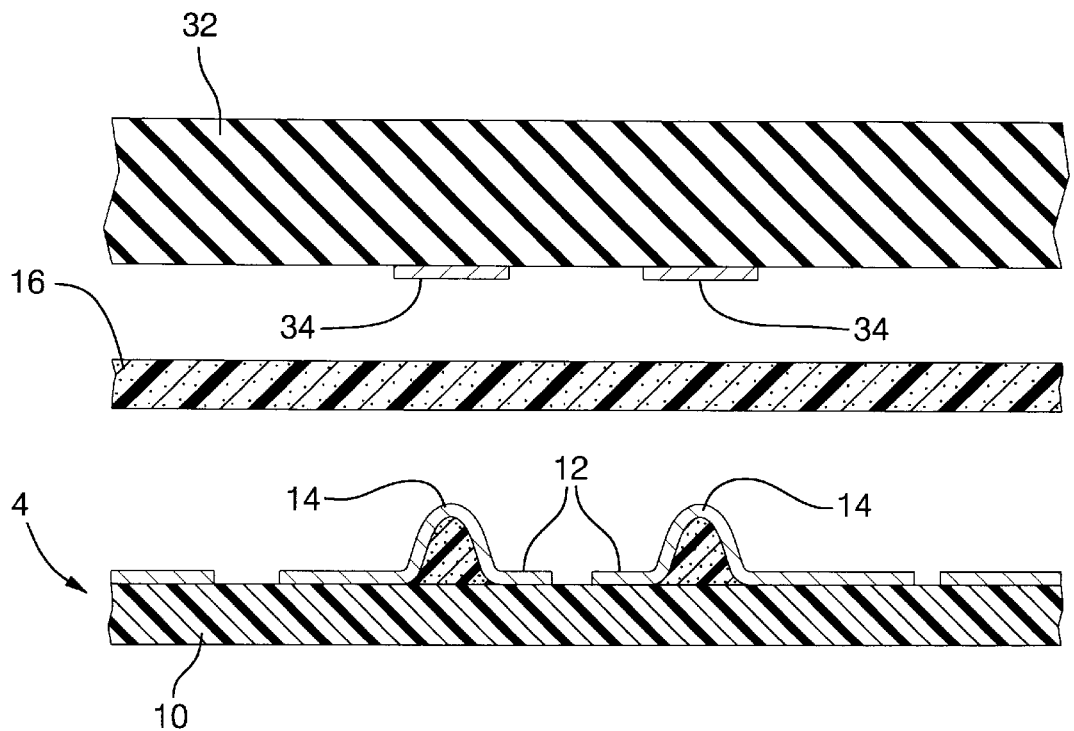
FIGS. 3–4 illustrate a method of laminating or bonding a flexible circuit and an electronic component.
Figure 4:
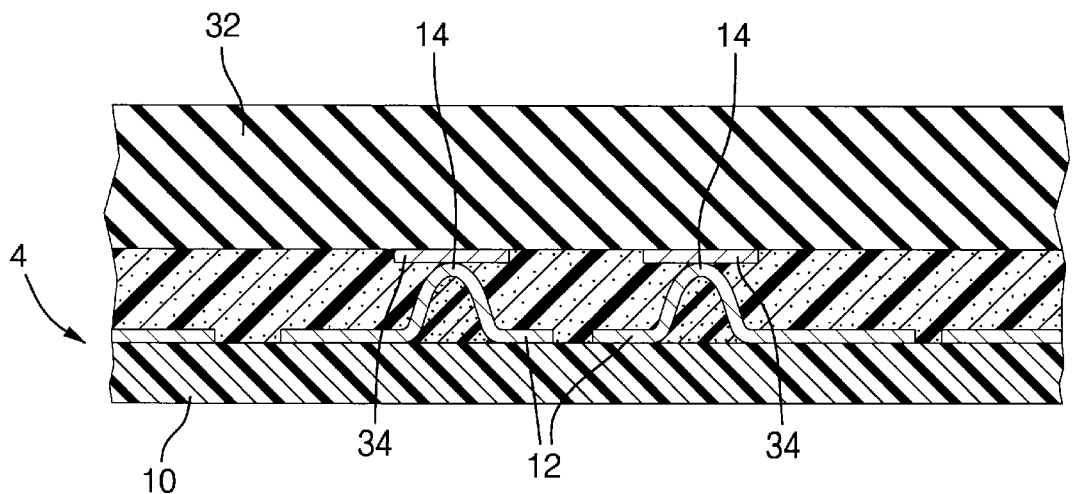

The above concepts can be applied with respect to an electronic component 32 such as an integrated circuit chip with contact pads 34 thereon as shown in FIGS. 3–4. A first circuit layer 4 is provided including a dielectric layer 10 with electrical trace thereon and having raised contact features 14. The solid adhesive layer 16 or intermediate layer is provided between the electronic component 32 and circuit layer 4 and the layers laminated together so that the raised features 14 penetrate the solid adhesive to make contact to the contact pads 34. Solder or other suitable material may be provided on the contact pads 34.

We claim:

1. A method of making a multi-layer electrical interconnect system comprising:

providing a first circuit layer having a first set of electrically conductive traces with raised features on a first dielectric layer, and a first adhesive layer overlying the first circuit layer including the raised features, placing a second dielectric layer having holes formed therein over the first circuit so that the holes are aligned with the raised features, said second dielectric layer having a second set of electrically conductive traces formed on a top surface overlying the holes in the second dielectric layer and the raised features in the first circuit layer, wherein said adhesive layer does not have a hole formed therethrough at a location over any of the raised features, and bonding the layers together so that a raised feature of the first circuit layer penetrates the adhesive layer and provides an electrical contact with one of the electrically conductive traces on the second dielectric layer.

2. A method as set forth in claim 1 wherein said second dielectric layer includes a solder dot received in one of said holes in the second dielectric layer for soldering a raised feature on the first circuit to one of the electrically conductive traces on the second dielectric layer.

3. A method as set forth in claim 1 further comprising the step of placing a layer of silicone gel over the adhesive layer prior to placing the second dielectric layer on said first circuit.

4. A method as set forth in claim 1 further comprising the steps of placing silicone gel into one of the holes formed in the second dialectric layer prior to laminating the layers together.

5. A method as set forth in claim 1 wherein the first dielectric layer is flexible.

6. A method as set forth in claim 1 wherein the second dielectric layer is flexible.

7. A method of making an electrical interconnection system comprising:

providing a first circuit layer having electrical conductive trace with a raised contact feature;

providing an intermediate layer over the first circuit layer that does not have a hole formed therethrough at a location over the raised feature;

providing an electrical component over the intermediate layer and having a contact pad aligned with the raised feature; and laminating the layers to the component so that the raised contact feature penetrates the intermediate layer and makes electrical connection to the contact pad.

8. A method as set forth in claim 7 wherein the component comprises an integrated circuit chip.

9. A method as set forth in claim 7 wherein the intermediate layer comprises an adhesive layer.

10. A method as set forth in claim 7 wherein the circuit layer is a flexible circuit layer.

11. A method as set forth in claim 1 wherein the adhesive layer is one of a solid sheet, paste, gel or liquid.

12. A method as set forth in claim 7 wherein the intermediate layer is one of a solid sheet, paste, gel or liquid.

13. A method of making a multi-layer electrical interconnect system comprising:

providing a first circuit layer having a first set of electrically conductive traces with raised features on a first dielectric layer, and a first adhesive layer overlying the first circuit layer including the raised features, placing a second dielectric layer having holes formed therein over the first circuit so that the holes are aligned with the raised features, said second dielectric layer having a second set of electrically conductive traces formed on a top surface overlying the holes in the second dielectric layer and the raised features in the first circuit layer, wherein said adhesive layer does not have a hole formed therethrough at a location over any of the raised features, bonding the layers together so that a raised feature of the first circuit layer penetrates the adhesive layer and provides an electrical contact with one of the electrically conductive traces on the second dielectric layer, providing a second adhesive layer over lying the second set of electrical conductive traces including raised portions of the second set of electrically conductive traces, placing a third dielectric layer having holes formed therein over the second set of traces so that the holes are aligned with the raised features on the second set of traces, said third dielectric layer having a third set of electrically conductive traces formed on a top surface overlying the holes in the third dielectric layer and the second set of traces having raised features, and wherein the second adhesive layer does not have a hole formed therethrough at a location over the raised features on the second traces, and bonding the layers together so that a raised features of the second set of traces penetrates the second adhesive layer and provides an electrical contact with one of the electrically conductive traces on the third dielectric layer.

* * * * *